(12) United States Patent
Sahu et al.

(10) Patent No.: US 11,705,867 B2
(45) Date of Patent: Jul. 18, 2023

(54) DYNAMICALLY BIASED POWER AMPLIFICATION

(71) Applicant: TEXAS INSTRUMENTS INCORPORATED, Dallas, TX (US)

(72) Inventors: Debapriya Sahu, Bangalore (IN); Rohit Chatterjee, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/690,415

(22) Filed: Mar. 9, 2022

(65) Prior Publication Data

US 2022/0200534 A1 Jun. 23, 2022

Related U.S. Application Data

(63) Continuation of application No. 16/180,879, filed on Nov. 5, 2018, now Pat. No. 11,303,248.

(Continued)

(51) Int. Cl.
*H03F 1/02* (2006.01)
*H03F 3/21* (2006.01)
(Continued)

(52) U.S. Cl.
CPC ........... *H03F 1/0222* (2013.01); *H03F 3/193* (2013.01); *H03F 3/211* (2013.01); *H03F 3/45179* (2013.01); *H03F 3/45475* (2013.01); *H03F 2200/102* (2013.01); *H03F 2200/171* (2013.01); *H03F 2200/273* (2013.01); *H03F 2200/378* (2013.01); *H03F 2200/387* (2013.01); *H03F 2200/393* (2013.01); *H03F 2200/451* (2013.01);

(Continued)

(58) Field of Classification Search
CPC .................................................... H03F 1/0222
See application file for complete search history.

(56) References Cited

U.S. PATENT DOCUMENTS 7,142,059 B2 11/2006 Klein
8,761,305 B2 * 6/2014 Chan ..................... H04M 3/533
375/295

(Continued)

OTHER PUBLICATIONS

Namsik Ryu, et al., A Fullty Integrated High Efficiency RF Power Amplifier for WLAN Application in 40 nm Standard CMOS Process; Publication; IEEE Microwave and Wireless Components Letters, vol. 25, No. 6, Jun. 1, 2015; 3 pgs.

(Continued)

*Primary Examiner* — Patricia T Nguyen
(74) *Attorney, Agent, or Firm* — Mandy Barsilai Fernandez; Frank D. Cimino

(57) ABSTRACT

One example includes a device that is comprised of a pre-power amplifier, a power amplifier, a signal path, and a dynamic bias circuit. The pre-power amplifier amplifies an input signal and outputs a first amplified signal. The power amplifier receives the first amplified signal and amplifies the first amplified signal based on a dynamic bias signal to produce a second amplified signal at an output thereof. The signal path is coupled between an output of the pre-power amplifier and an input of the power amplifier. The dynamic bias circuit monitors the first amplified signal, generates the dynamic bias signal, and outputs the dynamic bias into the signal path.

20 Claims, 2 Drawing Sheets

Related U.S. Application Data

(60) Provisional application No. 62/611,813, filed on Dec. 29, 2017.

(51) Int. Cl.
*H03F 3/193* (2006.01)
*H03F 3/45* (2006.01)
*H03H 7/06* (2006.01)

(52) U.S. Cl.
CPC ............... *H03F 2203/21139* (2013.01); *H03F 2203/21157* (2013.01); *H03H 7/06* (2013.01)

(56) References Cited

U.S. PATENT DOCUMENTS

| | | | | |
|---|---|---|---|---|
| 9,954,490 | B2* | 4/2018 | Watkins | ............... H03F 1/0222 |
| 2002/0071497 | A1* | 6/2002 | Bengtsson | ............ H04L 27/362 |
| | | | | 332/127 |
| 2006/0091959 | A1 | 5/2006 | Chow | |
| 2007/0281635 | A1 | 12/2007 | Mccallister | |
| 2008/0146171 | A1* | 6/2008 | Hellberg | ................. H03F 1/32 |
| | | | | 455/127.1 |
| 2013/0043953 | A1 | 2/2013 | Spiegel | |
| 2015/0171797 | A1 | 6/2015 | Ni | |
| 2017/0085223 | A1 | 3/2017 | Musial | |
| 2018/0198424 | A1 | 7/2018 | Sharma | |
| 2018/0241347 | A1* | 8/2018 | Petrovic | .................. H03F 3/193 |

OTHER PUBLICATIONS

Sai-Wang Tam, et al.; "A Dual Band (2G/5G) IEEE 802.11b/g/n/ac 80 MHz bandwidth AM-AM Envelope Feedback Power Amplifier with Digital Pre-Distortion"; IEEE Radio Frequency Integrated Circuits Symposium; Nov. 30, 2015; 4 pgs.

Kunhee Cho, et al.; "A 25.6 dBm Wireless Transmitter using RF-PWM with Carrier Switching in 130-nm CMOS"; IEEE Radio Frequency Integrated Circuits Symposium; Nov. 30, 2015; 4 pgs.

Feipeng Wang, et al.; "Design of Wide-Bandwidth Envelope-Trackng Power Amplifiers for OFDM Applications"; IEEE transactions on Microwave theory and techniques, vol. 53, No. 4 Apr. 1, 2005; 12 pgs.

Bumman Kim, et al.; "The Doherty Power Amplifier"; IEEE Microwave Magazine; Oct. 1, 2006; 9 pgs.

\* cited by examiner

DYNAMICALLY BIASED POWER AMPLIFICATION

CROSS REFERENCE TO RELATED APPLICATION

This application is a continuation of U.S. patent application Ser. No. 16/180,879, filed Nov. 5, 2018, which claims the benefit of priority from U.S. Provisional Patent Application No. 62/611,813, filed Dec. 29, 2017, and entitled DYNAMICALLY BIASED POWER AMPLIFICATION, both of which are incorporated herein by reference in their entirety.

TECHNICAL FIELD

This disclosure relates generally to power amplification, and more specifically to signal tracking power amplification.

BACKGROUND

Many existing power amplifier designs exhibit poor power efficiency at power levels below their saturated power level. A Doherty power amplifier was developed generally to amplify varying amplitude signals in a linear manner with improved efficiency. A basic Doherty amplifier design uses two amplifier circuits within the one overall amplifier to accommodate the different operating conditions. The use of two circuits (e.g., two transformers) for power combining is area inefficient. An envelope tracking power amplifier splits the modulated signal into amplitude and phase modulated parts, which are processed by separate circuit paths. If the delay between the signals in the different circuit paths are not matched properly, the power amplification may be corrupted, which can adversely affect certain applications (e.g., amplification for high bandwidth systems).

SUMMARY

One example includes a device that is comprised of a pre-power amplifier, a power amplifier, a signal path, and a dynamic bias circuit. The pre-power amplifier amplifies an input signal and outputs a first amplified signal. The power amplifier receives the first amplified signal and amplifies the first amplified signal based on a dynamic bias signal to produce a second amplified signal at an output thereof. The signal path is coupled between an output of the pre-power amplifier and an input of the power amplifier. The dynamic bias circuit monitors the first amplified signal, generates the dynamic bias signal, and outputs the dynamic bias signal into the signal path.

Another example includes a method. The method includes amplifying an input signal to produce a first amplified signal. The method further includes providing the first amplified signal over a galvanic isolation signal path to produce an isolated version of the first amplified signal that is isolated from the first amplified signal. The method further includes amplifying the isolated version of the first amplified signal, based on a dynamic bias signal, to produce a second amplified signal. The method yet further includes monitoring the first amplified signal. The method further includes generating the dynamic bias signal based on the monitoring. The method also includes feeding the dynamic bias signal into the galvanic isolation signal path.

Another example includes another device that is comprised of a pre-power amplifier, a power amplifier, a signal path, a galvanic isolator, a level detector, a filter, and a combiner. The pre-power amplifier amplifies an input signal and output a first amplified signal. The power amplifier receives the first amplified signal and amplifies the first amplified signal based on a dynamic bias signal to produce a second amplified signal at an output thereof. The signal path is coupled between an output of the pre-power amplifier and an input of the power amplifier. The galvanic isolator is disposed between the output of the pre-power amplifier and the input of the amplifier, with an output of the galvanic isolator including a bias tap to receive the dynamic bias signal. The level detector monitors a level of the first amplified signal and output a level signal representing the level of the first amplified signal. The filter mitigates harmonic signal features within the level signal and outputs a filtered level signal that varies according to the level of the first amplified signal. The combiner combines the filtered level signal with a DC bias signal to generate the dynamic bias signal, which is fed to the bias tap of the galvanic isolator.

DETAILED DESCRIPTION

The disclosure relates to power amplification and, more particularly to generating a dynamic bias signal for biasing a power amplifier based on tracking a pre-amplified signal. For example, a pre-power amplifier amplifies an input signal and outputs a first amplified signal. A power amplifier receives the first amplified signal via a signal path. For example, the signal path provides galvanic isolation (e.g., it includes an isolation transformer) between the pre-power amplifier and the power amplifier. The power amplifier amplifies the first amplified signal, which is received via the signal path, based on a dynamic bias signal to produce a second amplified signal. A dynamic bias circuit monitors the first amplified signal and generates the dynamic bias signal based on the first amplified signal.

Such an example provides for implementation of a radio frequency (RF) amplification device that is compact, without having a special requirement on it supply voltage, such as a very fast and linear power supply unit which reflects signal amplitude information at a supply of the power amplifier. This compact implementation is realized because it relies on a single power amplifier and without use of a secondary/auxiliary signal path. Moreover, the device is "production friendly," as it does not require special calibration, adjustment, or matching of components. In an example, the device is fabricated using approximately one-third the silicon area as compared to an existing radio frequency (RF) amplifier which attempts to achieve similar performance using secondary/auxiliary signal path. Furthermore, the device is power efficient, consuming approximately one-half as much power as existing RF amplifiers.

Figure 1:
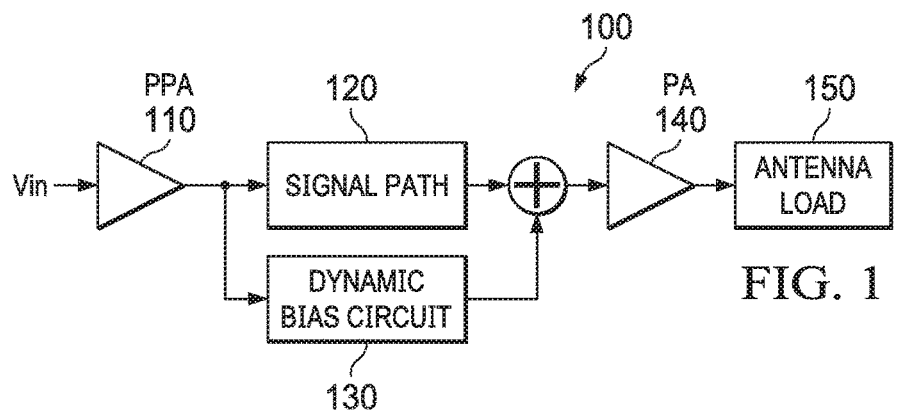
FIG. 1 illustrates an example device to generate a dynamic bias signal.

FIG. 1 illustrates an example device 100 to amplify an input signal Vin according to a dynamic bias signal. The device 100 includes a pre-power amplifier 110. The pre-power amplifier 110 amplifies an input signal and outputs a first amplified signal. The pre-power amplifier 110 receives an input signal Vin, amplifies this input signal Vin, and outputs a first amplified signal. In an example, the input signal Vin is a data signal that is being transmitted to a wireless network (not shown) by the device 100. For example, the input signal Vin is a 2.4 GHz signal. The pre-power amplifier 110 outputs the first amplified signal to both a signal path 120 and a dynamic bias circuit 130. For instance, the signal path 120 and the dynamic bias circuit 130 are arranged electrically parallel with each other. The signal path 120 couples an output of the pre-power amplifier 110 with an input of a power amplifier 140. The dynamic bias circuit 130 monitors the first amplified signal, generates the dynamic bias signal, and outputs/feeds the dynamic bias into the signal path 120. The power amplifier 140 receives the first amplified signal and amplifies the first amplified signal based on a dynamic bias signal to produce a second amplified signal at an output thereof. The power amplifier 140 receives the first amplified signal from the signal path 120, which is adjusted, dynamically, based on the dynamic bias signal. The power amplifier 140 amplifies the adjusted first amplified signal to produce a second amplified signal at an output thereof. The dynamic bias circuit 130 detects signal swing at the input of the power amplifier 140 and biases the amplified input signal that is received by the power amplifier 140. The dynamic bias circuit 130 detects signal swing at the input of the power amplifier 140 and biases the amplified input signal that is received by power amplifier 140 for improving and adjusting signal handling capacity of power amplifier 140 to properly and efficiently amplify a received instantaneous signal level. Thus, the dynamic bias circuit 130 tracks the first amplified signal and produces the dynamic bias signal based on this tracking. An antenna load 150 receives the second amplified signal and transmits the second amplified signal as a wireless RF signal.

Figure 2:
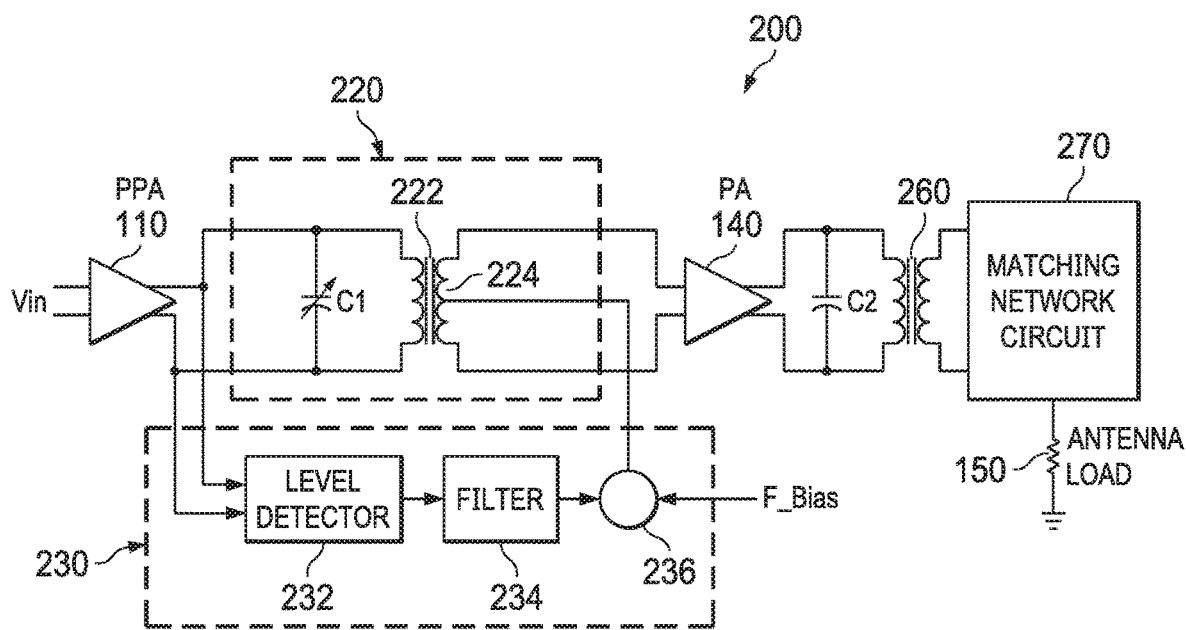
FIG. 2 illustrates another example device to generate the dynamic bias signal.

FIG. 2 illustrates another example device 200 to amplify an input signal Vin according to a dynamic bias signal. In this example, the pre-power amplifier 110 outputs a first amplified signal to both a signal path 220 and a dynamic bias circuit 230. As an example, the pre-power amplifier 110 is a differential amplifier, such as a common source or a common gate differential pair with cascade stages. The signal path 220 couples the output of the pre-power amplifier 110 with an input of a power amplifier 140. In an example, the power amplifier 140 is a differential amplifier, such as common source differential pair with cascade stages.

In the example of FIG. 2, the signal path 220 includes a variable capacitor C1 across differential output nodes of the pre-power amplifier 110. The variable capacitor C1 tunes the first amplified signal. The signal path 220 also includes a galvanic isolator 222 that couples the output of the pre-power amplifier 110 with the input of the power amplifier 140. The galvanic isolator 222 galvanically isolates the pre-power amplifier 110 from the power amplifier 140. In an example, the galvanic isolator 222 is one of a transformer, an opto-isolator, a thermal galvanic isolator, a Hall effect isolator, or any other galvanic isolator that galvanically isolates the pre-power amplifier 110 from the power amplifier 140. As a further example, the galvanic isolator 222 is a transformer that magnetically couples the output of the pre-power amplifier 110 to the input of the power amplifier 140 without signal attenuation. An amplitude and phase information of the input signal Vin both propagate through the signal path 220 and are both amplified by the pre-power amplifier 110 and the power amplifier 140.

The dynamic bias circuit 230 includes a full-wave rectifier based level detector 232. The full-wave rectifier base level detector 232 monitors a level of the first amplified signal and outputs a full-wave rectified signal whose average tracks a strength or voltage swing level of the first amplified signal. In an example, the full-wave rectifier base level detector 232 is an envelope detector that takes a high-frequency signal as an input and produces an output which is the full-wave rectified version with its average level tracking the envelope of the high-frequency input signal. A capacitor in a circuit of the filter 234 stores up charge on a rising edge of the high-frequency signal, and releases it slowly through a resistor when the high-frequency signal falls.

The dynamic bias circuit 230 provides the dynamic bias signal to the signal path 220 based on the first amplified signal (provided by pre-power amplifier 110) and an input bias signal (e.g., a fixed DC bias signal). The dynamic bias circuit 230 includes a full-wave rectifier base level detector 232 and a filter 234. An input of the filter 234 is coupled to receive the output of the full-wave rectifier base level detector 232. For example, the filter 234 includes resistor capacitor pairs that give out the average or direct current (DC) level of the output of the full-wave rectifier base level detector 232 which rectifies the differential output from the pre-power amplifier 110. In an example, the filter 234 comprises a resistor-capacitor (RC) filter. The filter 234 mitigates harmonic signal features within the level signal received from the full-wave rectifier base level detector 232 and outputs a filtered level signal that varies according to the level of the first amplified signal generated by the pre-power amplifier 110. In an example, the filter 234 filters out a $2^{nd}$ harmonic from the level signal.

The dynamic bias circuit 230 further includes a combiner 236. An output of the filter 234 is coupled to an input of the combiner 236. The combiner 236 receives the filtered level signal and combines the filtered version of the level signal with the DC bias signal F_bias. the combiner 236 thus generates the dynamic bias signal based on the rectified and filtered version of the level signal and the DC bias signal F_bias. The combiner 236 outputs this dynamic bias signal to the signal path 220. As an example, the galvanic isolator 222 includes a bias tap 224 to receive the dynamic bias from the combiner 236. The dynamic bias signal biases the power amplifier 140, dynamically, such as to maintain the power amplifier 140 at substantially its saturated power (Psat), e.g., at 20 dBm of Psat during a time instantaneous output power will reach Psat. As used herein, substantially is used to denote an intended property or function, but that variation (e.g., +/− about 5%) may occur, such as due to fabrication or component tolerances. Dynamically maintaining the power amplifier 140 at substantially its saturated power (Psat) increases a power efficiency of the power amplifier 140 compared to existing amplifiers, e.g., which are continuously biased with a Psat of 20 dBm resulting in wasted DC power when output is lower than Psat.

In some examples, the device 200 includes a capacitor C2 across differential output nodes of the power amplifier 140 to filter out unwanted frequencies from the differential output of the power amplifier 140. The device 200 further includes another galvanic isolator 260 coupled between the output of the power amplifier 140 and an input of a matching network circuit 270. The galvanic isolator 260 galvanically isolates the power amplifier 140 from the matching network circuit 270. In an example, the galvanic isolator 260 is a balun that converts the differential output of the power amplifier 140 to a signal that gets transmitted with the antenna load 150. In an example, the galvanic isolator 260 is one of a transformer, an opto-isolator, a thermal galvanic isolator, a Hall effect isolator, or any other galvanic isolator that galvanically isolates the power amplifier 140 from the matching network circuit 270. In an example, the power amplifier 140 is a differential power amplifier, with the galvanic isolator 260 galvanically isolating the differential amplifier from the matching network circuit 270 that converts the differential output from the power amplifier 140 to a single ended output.

The input of the matching network circuit 270 is coupled to an output of the galvanic isolator 260. The matching network circuit 270 receives (via galvanic isolator 260) the second amplified signal from the power amplifier 140. An output of the matching network circuit 270 is coupled to the antenna load 150. The matching network circuit 270 provides impedance matching between the device and the antenna load and further adapts the second amplified signal to the wireless network to which the device 200 is transmitting. In an example, the matching network circuit 270 adapts the second amplified signal to a wireless local area network (WLAN). For example, the matching network circuit 270 provides impedance matching between the output of the galvanic isolator 260 and the antenna load 150 to mitigate reflection and loss on the signal that is being transmitted with the antenna load 150. As an example, the WLAN is a wireless computer/device network that wirelessly links two or more devices using wireless communication within a limited area such as a home, school, computer laboratory, or office building. Through a gateway, the WLAN can also provide a connection to a wider network, e.g., the Internet. In an example, the WLAN is based on at least one of the IEEE 802.11 standards.

Figure 3:
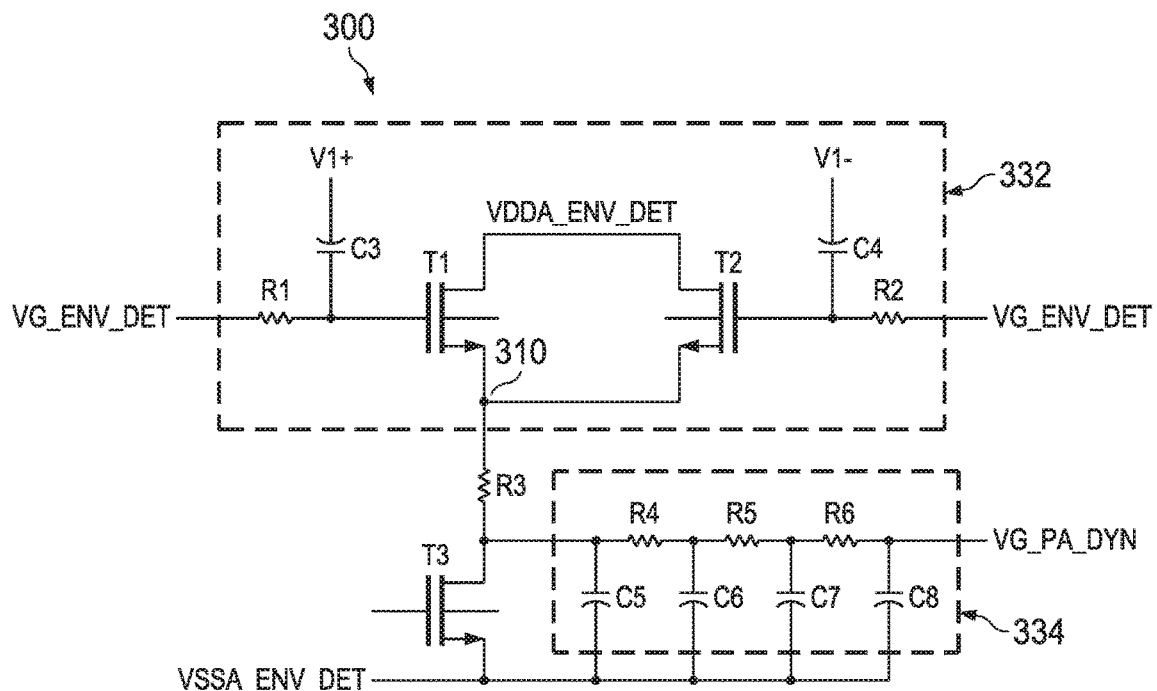
FIG. 3 illustrates an example circuit that includes a level detector and filter.

FIG. 3 illustrates an example dynamic bias circuit 300 that includes the full-wave rectifier base level detector 332 and filter 334. The full-wave rectifier base level detector 332 includes first and second electronic switch devices T1 and T2 that are coupled to each other. In an example, the first and second electronic switch devices T1 and T2 are field effect transistors (FETs). The drains of the first and second electronic switch devices T1 and T2 are biased at suitable voltage level, VDDA_ENV_DET in dynamic bias circuit 300, and the sources of the first and second electronic switch devices T1 and T2 are coupled together and to an input node of the filter 334, via a resistor R3. In an example, the voltage level VDDA_ENV_DET is approximately 1.2 volts. A full-wave rectified node 310 is at a point in the circuit 300 where the sources of the electronic switches devices T1 and T2 are coupled together. This full-wave rectified node 310 sums the voltages from the rectified half-cycles from the sources of the electronic switch devices T1 and T2.

Resistors R1 and R2, and capacitors C3 and C4, are coupled to the gates of the first and second electronic switch devices T1 and T2, respectively. The sides of the capacitors C3 and C4 opposite the gates of the first and second electronic switches devices T1 and T2 are coupled to the outputs of the pre-power amplifier 110 (shown in FIG. 2) to receive the differential first amplified signals, demonstrated as V1+ and V1−. A gate voltage signal VG_ENV_DET is applied to the resistors R1 and R2 opposite the side of the resistors R1 and R2 that are coupled to the gates of the first and second electronic switch devices T1 and T2. In an example, the gate voltage signal VG_ENV_DET is a fixed DC bias signal (F_bias).

The filter 334 provides a filtered level signal, which is illustrated as signal VG_PA_DYN at a node in the circuit 300 where capacitor C8 and resistor R6 are coupled together. For example, the VG_PA_DYN is supplied to tap 224 of the galvanic isolator (e.g., a transformer) 222 in the signal path 220 to dynamical bias the power amplifier 140, as disclosed herein.

The circuit 300 includes a third electronic switch device T3. In an example, this third electronic switch device T3 is a FET. The side of the resistor R3 opposite the full-wave rectified node 310 is coupled to this third electronic switch device T3. The drain of the electronic switch device T3 is coupled to the resistor R3 opposite a side of the resistor R3 coupled to the full-wave rectified node 310. The resistor R3 is a level-shifting resistor that controls a DC component of the dynamic bias signal, which adjusts small signal voltage gain of power amplifier 140 shown in FIG. 2. The source of the electronic switch device T3 is coupled to a side of the capacitors C5-C8 opposite a side coupled to the resistors R4-R6. A control signal with defined voltage level is applied to the gate of the electronic switch device T3 to control application of the dynamic bias signal to the side of the capacitors C5-C8 opposite a side coupled to the resistors R4-R6 and thereby turn on (or off) envelope detection of the circuit 300. As an example, the control voltage is generated by pumping a defined reference current into the drain terminal of another transistor device having its drain and gate electrically shorted together and its gate coupled to the gate of the electronic switch device T3. Thus, the electronic switch device T3 can be selectively activated to turn on the dynamic bias or deactivated to turn off the dynamic bias.

In this example, the filter 334 is a resistor-capacitor (RC) filter circuit. The filter 334 includes a plurality (e.g., four in this example) of capacitors C5-C8, with one end of each of the capacitors C5-C8 being coupled together. The opposite end of the capacitors C5-C7 is coupled to a neighboring capacitor via respective resistors R4-R6. Thus, the resistors R4-R6 and capacitors C5-C8 form an RC filter circuit adapted to implement a low pass filter transfer function. A voltage VSSA_ENV_DET (e.g., an electrical ground reference) is connected to the side of the capacitors C5-C8 opposite that which is coupled to the resistors R4-R6.

Figure 4:
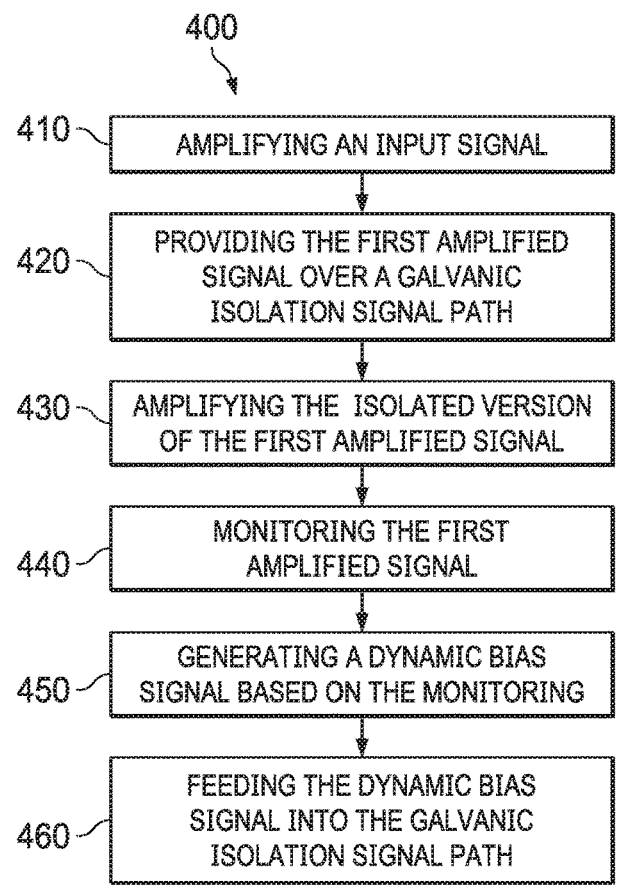
FIG. 4 illustrates an example method of performing signal tracking power amplification.

In view of the foregoing structural and functional features described above, a method will be better appreciated with reference to FIG. 4. While, for purposes of simplicity of explanation, the method of FIG. 4 is shown and described as executing serially, the method is not limited by the illustrated order, as some aspects may, in other examples, occur in different orders and/or concurrently from that shown and described herein. Moreover, not all illustrated features may be required to implement the method of FIG. 4. Further, the method of FIG. 4 may include additional features as described above in accordance with FIGS. 1-3.

FIG. 4 illustrates an example method 400 of performing signal tracking power amplification. At 410, the method 400 includes amplifying the input signal Vin to produce a first amplified signal. In an example, the pre-power amplifier 110 receives the input signal Vin, amplifies this input signal Vin, produces the first amplified signal, and outputs the first amplified signal.

At 420, the method 400 further includes providing the first amplified signal over a galvanic isolation signal path to produce an isolated version of the first amplified signal that is isolated from the first amplified signal. In an example, the pre-power amplifier 110 outputs a first amplified signal to the signal path 220 that includes the galvanic isolator 222 that produces an isolated version of the first amplified signal that is isolated from the first amplified signal.

At 430, the method 400 further includes amplifying the isolated version of the first amplified signal, based on a dynamic bias signal, to produce a second amplified signal. In an example, the power amplifier 140 amplifies the first amplified signal based on the dynamic bias signal received from the dynamic bias circuit 130/230. The power amplifier 140 produces this second amplified signal.

At 440, the method 400 yet further includes monitoring the first amplified signal. In an example, the dynamic bias circuit 130/230 includes the full-wave rectifier base level detector 232/332 to monitor a level of the first amplified signal and output the level signal representing the level of the first amplified signal. The method 400 may further include mitigating harmonic signal features within the level signal and outputting the filtered level signal that varies according to the level of the first amplified signal. In an example, the filter 234/334 performs such mitigating and outputting of the filtered level signal.

At 450, the method 400 even further includes generating the dynamic bias signal based on the monitoring at 440. In an example, the dynamic bias circuit 130/230 monitors the first amplified signal, generates the dynamic bias signal, and outputs the dynamic bias signal to the power amplifier 140. In another example, the dynamic bias circuit 230 includes the combiner 236 that receives the filtered level signal from the filter 234/334, combines the filtered version of the level signal with the DC bias signal F_bias, and generates the dynamic bias signal based on the filtered version of the level signal and the DC bias signal F_bias. The combiner 236 outputs this dynamic bias signal to the bias tap 224 of the galvanic isolator 222.

At 460, the method 440 also includes feeding the dynamic bias signal into the galvanic isolation signal path. In an example, the combiner 236 receives the filtered level signal and combines the filtered version of the level signal with the DC bias signal F_bias. The combiner 236 generates the dynamic bias signal based on the filtered version of the level signal and the DC bias signal F_bias. The combiner 236 outputs this dynamic bias signal to the signal path 220, e.g., the bias tap 224. As an example, the galvanic isolator 222 includes the bias tap 224 to receive the dynamic bias from the combiner 236.

The method 400 may further include transmitting the second amplified signal to a wireless network. In an example, the matching network circuit 270 converts the differential output from the power amplifier 140 to a single ended output that is output to the antenna load 150.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A device comprising:
    a power amplifier configured to amplify a first signal based on a dynamic bias signal to produce an amplified signal at an output; and
    a dynamic bias circuit comprising a filter and coupled to the power amplifier, wherein the dynamic bias circuit is configured to:
        monitor the first signal;
        generate the dynamic bias signal based on an output of the filter; and
        output the dynamic bias signal, wherein the dynamic bias circuit comprises:
            a first transistor having a current path coupled to the filter via a resistor; and
            a second transistor having a current path coupled to the filter via the resistor.

2. A device, comprising:
    a pre-power amplifier configured to:
        amplify an input signal; and
        output a first amplified signal;
    a power amplifier configured to:
        receive the first amplified signal; and
        amplify the first amplified signal based on a dynamic bias signal to produce a second amplified signal at an output; and
    a dynamic bias circuit configured to:
        monitor the first amplified signal;
        generate the dynamic bias signal; and
        output the dynamic bias signal, wherein the dynamic bias circuit includes a level detector configured to monitor a level of the first amplified signal and output a level signal representing the level of the first amplified signal, wherein the dynamic bias circuit comprises a filter, and wherein the level detector comprises first and second field effect transistors, and wherein sources of the first and second field effect transistors are coupled together and to an input node of the filter via a resistor.

3. The device according to claim 2, wherein the filter is configured to mitigate harmonic signal features within the level signal and output a filtered level signal that varies according to the level of the first amplified signal.

4. The device according to claim 2, wherein the dynamic bias circuit further includes a combiner configured to combine a filtered level signal with a DC bias signal to generate the dynamic bias signal, wherein the filtered level signal is generated by an output of the filter.

5. The device according to claim 2, wherein the filter comprises a resistor-capacitor (RC) filter circuit.

6. A device comprising:
    a pre-power amplifier configured to:
        amplify an input signal; and
        output a first amplified signal;
    a power amplifier configured to:
        receive the first amplified signal; and
        amplify the first amplified signal based on a dynamic bias signal to produce a second amplified signal at an output; and
    a dynamic bias circuit configured to:
        monitor the first amplified signal;
        generate the dynamic bias signal; and
        output the dynamic bias signal, wherein the dynamic bias circuit comprises:
            a combiner configured to output the dynamic bias signal; and
            a level detector comprising:
                a first transistor having a current path coupled to the combiner via a resistor; and
                a second transistor having a current path coupled to the combiner via the resistor.

7. The device according to claim 6, wherein the device further comprises a galvanic isolator coupled to the output of the power amplifier, and a matching network circuit configured to match an impedance between an output of the galvanic isolator and a load.

8. The device according to claim 7, wherein the power amplifier is a differential power amplifier, the device further including another galvanic isolator configured to galvanically isolate the differential power amplifier from the pre-power amplifier.

9. The device according to claim 7, further comprising the load wherein the load is an antenna.

10. A method comprising:
amplifying an input signal to produce a first amplified signal;
amplifying the first amplified signal, based on a dynamic bias signal, to produce a second amplified signal;
monitoring the first amplified signal;
generating the dynamic bias signal based on the monitoring; and
galvanically isolating the first amplified signal from the dynamic bias signal.

11. The method according to claim 10, wherein the monitoring comprises monitoring a level of the first amplified signal and the method further including outputting a level signal representing the level of the first amplified signal.

12. The method according to claim 11, further comprising:
mitigating harmonic signal features within the level signal; and
outputting a filtered level signal that varies according to the level of the first amplified signal.

13. The method according to claim 10, wherein the generating comprises:
receiving a filtered level signal generated based on the first amplified signal;
combining the filtered level signal with a DC bias signal to generate the dynamic bias signal; and
outputting the dynamic bias signal.

14. The method according to claim 10, further comprising tuning the first amplified signal.

15. The method according to claim 10, further comprising transmitting the second amplified signal to a wireless network.

16. The device according to claim 1, wherein the dynamic bias circuit further comprises a third transistor having a current path coupled to the resistor.

17. The device according to claim 16, wherein the filter comprises an RC low-pass filter having an input coupled to the current path of the third transistor.

18. The device according to claim 17, wherein the dynamic bias circuit further comprises a combiner having a first input coupled to an output of the RC low-pass filter, a second input configured to receive a first bias signal, and an output configured to generate the dynamic bias signal.

19. The device according to claim 18, wherein the first bias signal is a DC bias signal.

20. The device according to claim 7, wherein the galvanic isolator is a balun transformer.

* * * * *